United States Patent [19]
Ho

[11] Patent Number: 6,074,028
[45] Date of Patent: Jun. 13, 2000

[54] COVER PLATE POSITIONING DEVICE FOR PERSONAL COMPUTER

[76] Inventor: Hsin Chien Ho, 20F-1, 268, Wen-Hua Road, Pan Chiao City, Taipei Hsien, Taiwan

[21] Appl. No.: 09/003,151

[22] Filed: Jan. 6, 1998

[51] Int. Cl.[7] ..................................................... H05K 5/00
[52] U.S. Cl. .................................. 312/223.2; 312/265.6; 361/683
[58] Field of Search ............................. 312/223.1, 223.2, 312/257.1, 265, 265.6; 361/683, 695, 724

[56] References Cited

U.S. PATENT DOCUMENTS

| | | | |
|---|---|---|---|
| 5,397,176 | 3/1995 | Allen et al. | 312/265.6 X |
| 5,593,220 | 1/1997 | Seid et al. | 312/265.6 |
| 5,743,606 | 4/1998 | Scholder | 312/223.2 |
| 5,790,372 | 8/1998 | Dewey et al. | 312/223.2 X |
| 5,839,804 | 11/1998 | Ho | 312/223.2 |
| 5,845,977 | 12/1998 | Neukam et al. | 312/223.2 X |

*Primary Examiner*—Peter M. Cuomo
*Assistant Examiner*—Stephen Vu
*Attorney, Agent, or Firm*—Dougherty & Troxell

[57] ABSTRACT

A cover plate positioning device for personal computers including a metal housing and a plastic cover plate. The metal housing is provided with a retaining block at either side thereof. The cover plate has a front side and two side portions. Each side portion has a small window and a fastening plate secured to an inner side thereof. The fastening plate has a push block projecting from the window and a hook. When the cover plate is fitted over the housing, the hook of each fastening plate will engage the corresponding retaining block of the housing to quickly position the cover plate. The cover plate can be quickly disassembled from the housing by pushing the push block of each fastening plate. Use of screws is therefore eliminated.

4 Claims, 3 Drawing Sheets

COVER PLATE POSITIONING DEVICE FOR PERSONAL COMPUTER

BACKGROUND OF THE INVENTION (a) Field of the Invention

The present invention relates to a cover plate positioning device for personal computers.

(b) Description of the Prior Art

A computer housing generally includes a metal housing frame, a cover plate for covering the housing frame, and a face plate. The cover plate is openable to allow maintenance, repairs, or replacement of computer components and parts.

Conventional cover plates are integrally made by punching. The are assembled to the housing frame by means of screws. In general, the face plate is assembled after the cover plate is mounted in position. After years of developments, the metal housing has evolved into plastic housing. But in general, the inside of the plastic housing is lined with a thin metal sheet to avoid EMI effects. Plastic housings are less costly, fast to produce, and provide greater variety in outward appearance. However, the cover plates of plastic housings have still to be assembled using screws, which is inconvenient.

SUMMARY OF THE INVENTION

A primary object of the present invention is to provide a cover plate positioning device for personal computers which allows quick and convenient assembly and removal of the cover plate to and from a metal housing. According to the invention, a metal housing and a plastic cover plate are provided. The metal housing is provided with a retaining block at either side thereof. The cover plate has a front side and two side portions. Each side portion has a small window and a fastening plate secured to an inner side thereof. The fastening plate has a push block projecting from the window and a hook. When the cover plate is fitted over the housing, the hook of each fastening plate will engage the corresponding retaining block of the housing to quickly position the cover plate. The cover plate can be quickly disassembled from the housing by pushing the push block of each fastening plate. Use of screws is therefore eliminated.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
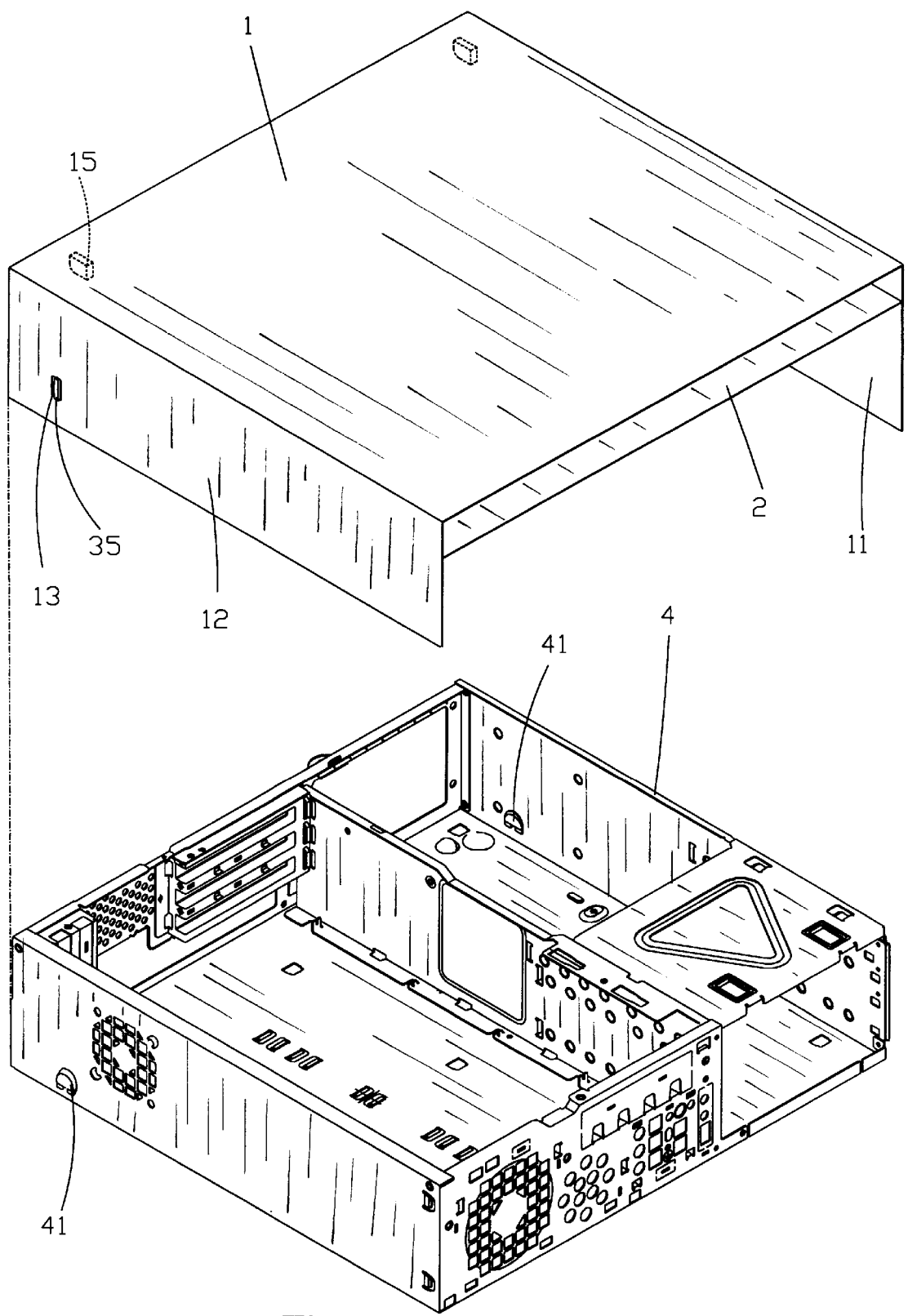
FIG. 1 is a perspective exploded view of the present invention.
Figure 2:
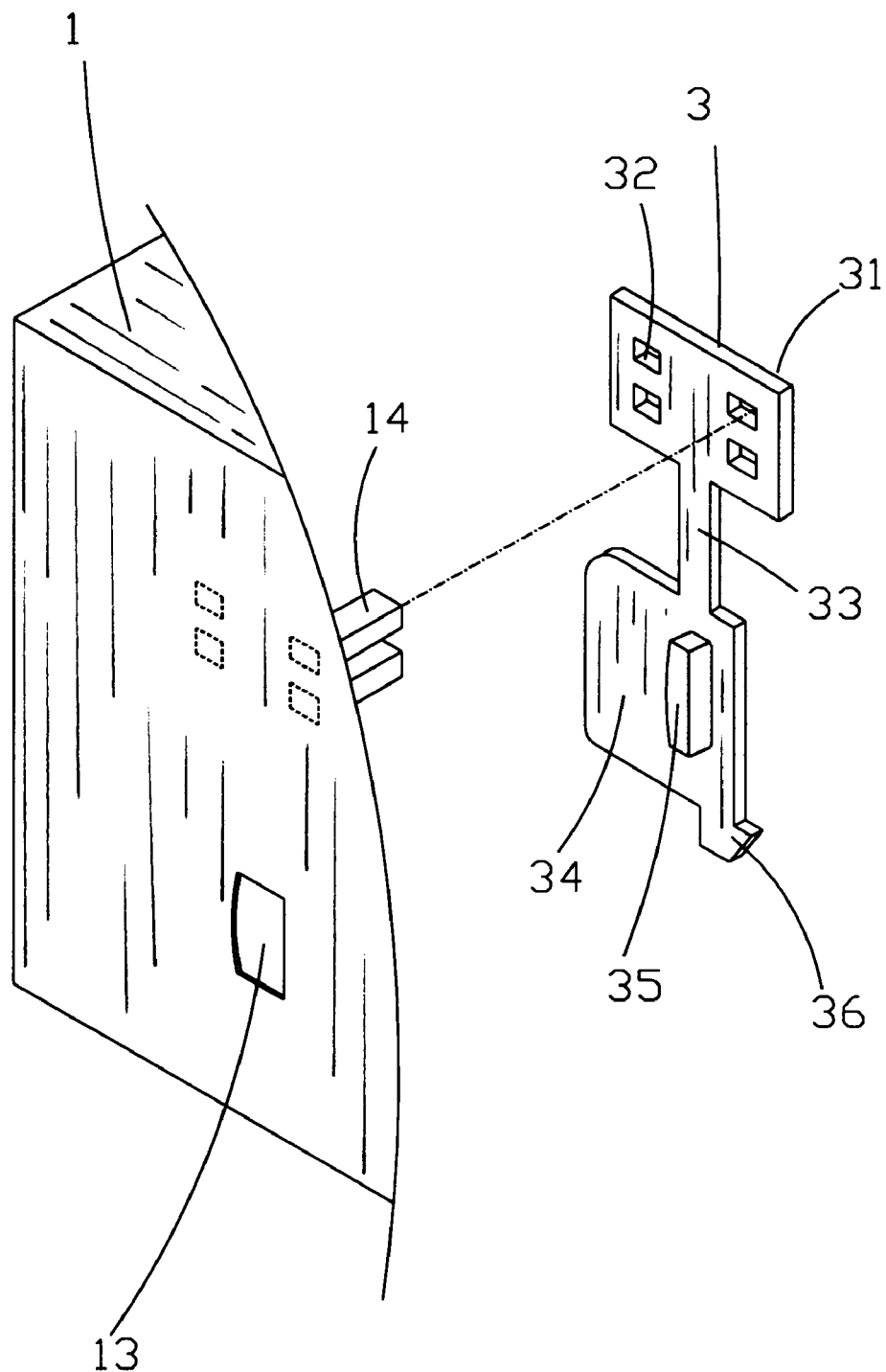
FIG. 2 is a perspective view of a resilient fastening plate according to the present invention.
Figure 3:
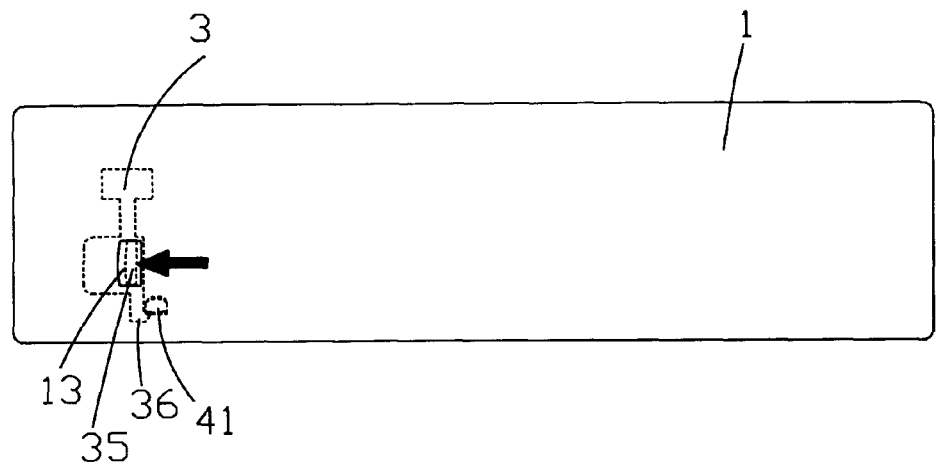
FIG. 3 is a side schematic view of the engagement of the cover plate and the housing using the fastening plates.
Figure 4:
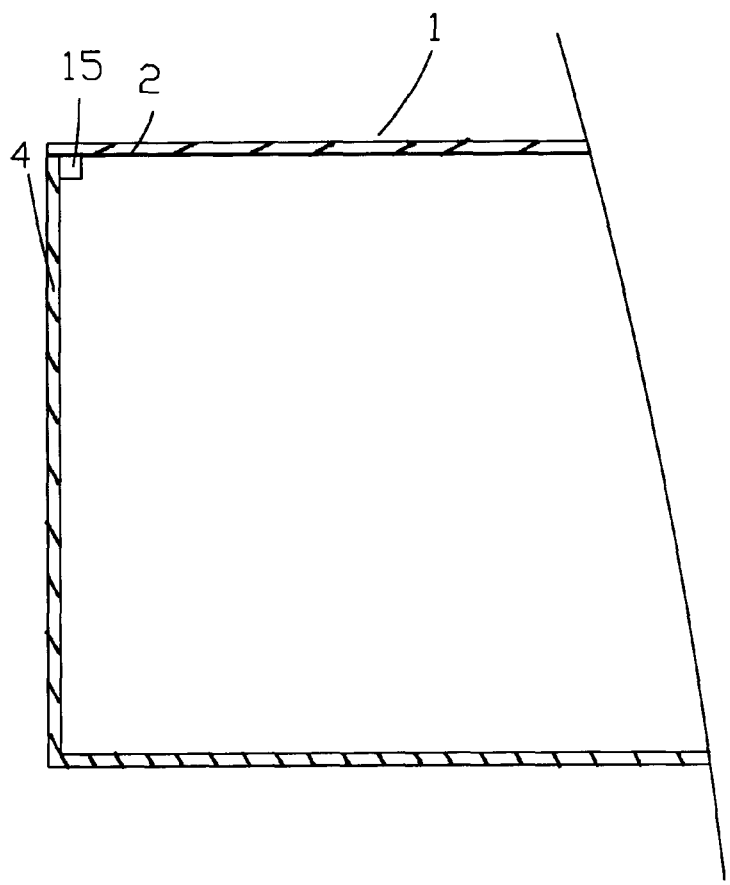
FIG. 4 illustrates the stop blocks when the cover plate is assembled to the housing.

With reference to FIG. 1, the present invention comprises a cover plate 1 made of plastics. A metal laminate 2 is provided at an inner side of the front side of the cover plate 1 to avoid EMI effects. The cover plate 1 has two side portions 11 and 12, they are respectively provided with a small window 13 at a lower end thereof. At the inner side of each side portion near the window 13, there are provided a plurality of posts 14. The present invention further comprises a resilient fastening plate 3 including a securing portion 31 at an upper end provided with through holes 32 for matching the posts 14, an urging portion 34, and a neck portion 33 connecting the securing portion 31 and the urging portion 34. The urging portion 34 has a push block 35 disposed thereof, and a hook 36 extending from one side thereof. The through holes 32 receive the posts 14 of the cover plate 1 and the fastening plate 3 may be secured on the cover plate 1 by means of fusion such that the push block 35 is located in the window 13 and projects therefrom. By pushing the push block 35 sideways, the fastening plate 3 and its hook 36 may be moved sideways. The cover plate 1 is further provided with stop blocks 15 near its rear end. A metal housing 4 is provided with retaining blocks 41 at both sides thereof for matching the fastening plates 3 at both side portions 11 and 12 of the cover plate 1, so that after the cover plate 1 is fitted over the metal housing 4, the hooks 36 of the fastening plates 3 may automatically engage the retaining blocks 41 to position the cover plate 1 on the housing 4. At the same time, the stop blocks 15 at the inner side of the cover plate 1 will urge against the upper rim of the rear end of the housing 4 to prevent the cover plate 1 from rearward displacement. (It is only necessary to prevent the rearward displacement of the cover plate 1 since its possible forward displacement will be checked by the face plate of the computer.) Referring to FIGS. 3 and 4, the cover plate 1 can be quickly removed from the housing 4 by simply pushing the push blocks 35 of the fastening plates 3 to release the engagement. Hence, the assembly of disassembly of the cover plate and the housing can be accomplished with ease and speed.

It should be appreciated that the present invention can be used on vertical or horizontal type personal computers.

Although the present invention has been illustrated and described with reference to the preferred embodiment thereof, it should be understood that it is in no way limited to the details of such embodiment but is capable of numerous modifications within the scope of the appended claims.

What is claimed is:

1. A device for removably attaching a plastic cover plate to a computer housing frame, the housing frame having first and second spaced apart frame walls and a third frame wall connected to and extending between the first and second frame walls, the device comprising:

a) a plastic cover plate having spaced apart side portions extending substantially parallel to the first and second frame walls;

b) a window opening extending through each of the side portions of the plastic cover plate;

c) a retaining block extending from each of the first and second frame walls;

d) a resilient fastening plate secured to each of the side portions of the plastic cover plate, each of the resilient fastening plates including a securing portion secured to one of the side portions of the plastic cover plate, an urging portion having a hook extending in the direction of and being movable relative to the associated side portion of the plastic cover plate and a push block extending through the window opening in the associated side portion of the cover plate, and a neck portion connecting the securing portion and the urging portion whereby each of the hooks engages one of the retaining blocks to attach the plastic cover plate to the frame and whereby the urging portion is resiliently displaced in a disengagement direction by movement of the push block so as to disengage the hook from the associated retaining block to enable the plastic cover plate to be removed from the frame, the disengagement direction being along the associated side portion; and, e) at least one stop block on the plastic cover plate located so as to contact the third wall of the frame when the cover plate is attached to the frame to thereby prevent movement of the cover plate relative to the frame in the disengagement direction.

2. The device of claim 1 further comprising two stop blocks on the plastic cover plate.

3. The device of claim 1 further comprising:

a) at least one post extending from each of the side portions of the plastic cover plate; and, b) at least one through hole in the securing position of the resilient fastening plate, the at least one post extending into the at least one through hole to secure the resilient fastening plate to the side portion of the plastic cover plate.

4. The device of claim 3 further comprising a plurality of posts and a plurality of through holes.

* * * * *